(12) United States Patent
Xu

(10) Patent No.: US 10,461,102 B2
(45) Date of Patent: Oct. 29, 2019

(54) DISPLAY DEVICE, TRANSFLECTIVE ARRAY SUBSTRATE, AND MANUFACTURING METHOD THEREOF

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 25 days.

(21) Appl. No.: 15/743,671

(22) PCT Filed: Jan. 8, 2018

(86) PCT No.: PCT/CN2018/071693
§ 371 (c)(1),
(2) Date: Jan. 11, 2018

(87) PCT Pub. No.: WO2019/114064
PCT Pub. Date: Jun. 20, 2019

(65) Prior Publication Data
US 2019/0189649 A1    Jun. 20, 2019

(30) Foreign Application Priority Data
Dec. 15, 2017  (CN) .......................... 2017 1 1362732

(51) Int. Cl.
*H01L 27/12*  (2006.01)
*G02F 1/1362*  (2006.01)
(Continued)

(52) U.S. Cl.
CPC ........ *H01L 27/1288* (2013.01); *H01L 27/124* (2013.01); *H01L 27/127* (2013.01);
(Continued)

(58) Field of Classification Search
CPC ............... H01L 27/1288; H01L 27/124; H01L 27/1262; H01L 27/127; G02F 1/133555
See application file for complete search history.

(56) References Cited

U.S. PATENT DOCUMENTS

2006/0267016 A1* 11/2006 Ahn .................. G02F 1/133555
257/59
2007/0058116 A1*  3/2007 Lee .................. G02F 1/133555
349/114
(Continued)

FOREIGN PATENT DOCUMENTS

| CN | 103018951 A | 4/2013 |
| CN | 104199213 A | 12/2014 |

(Continued)

*Primary Examiner* — Bilkis Jahan
*Assistant Examiner* — Victor V Barzykin
(74) *Attorney, Agent, or Firm* — Andrew C. Cheng

(57) ABSTRACT

The present disclosure relates to a display device and a manufacturing method of a transflective array substrate. The transflective array substrate includes: a plurality of scanning lines, a plurality of data lines, and a plurality of pixel cells. Each of the pixel cells includes a thin film transistor (TFT), a photoresist layer, and at least one pixel electrode. The photoresist layer is configured on the TFT. Each of the pixel cells includes a reflective area configured above the photoresist layer. As such, light-reflection efficiency and brightness of the display device may be improved, so as to provide better user experience.

2 Claims, 8 Drawing Sheets

(51) Int. Cl.
*G02F 1/1335* (2006.01)
*G02F 1/1368* (2006.01)

(52) U.S. Cl.
CPC ........ H01L 27/1262 (2013.01); *G02F 1/1368* (2013.01); *G02F 1/133553* (2013.01); *G02F 1/136286* (2013.01); *G02F 2001/136222* (2013.01); *G02F 2201/123* (2013.01); *G02F 2203/09* (2013.01)

(56) References Cited

U.S. PATENT DOCUMENTS

2008/0204641 A1* 8/2008 Kurasawa ............. G02F 1/1323
349/114
2015/0205163 A1 7/2015 Shin et al.
2016/0377915 A1 12/2016 Kim

FOREIGN PATENT DOCUMENTS

CN 107357076 A 11/2017
CN 107463039 A 12/2017

* cited by examiner

Step S1

Step S3

DISPLAY DEVICE, TRANSFLECTIVE ARRAY SUBSTRATE, AND MANUFACTURING METHOD THEREOF

BACKGROUND

1. Technical Field

The present disclosure relates to display field, and more particularly to a display device, a transflective array substrate, and a manufacturing method thereof.

2. Description of Related Art

Transflective liquid crystal display (LCD) devices are capable of transmission and reflection simultaneously. The transflective LCD panel is configured within a pixel cell and includes a transmissive area with a transparent electrode and a reflective area with a reflective layer. The transmissive area of a pixel area and a backlight light-source may be adopted to display images at a dark place. The reflective area of the pixel area and ambient light beams may be adopted to display the images at a bright place. As such, the transflective LCD devices are suitable for a variety of environments in different brightness, thus the transflective LCD devices have been widely adopted.

However, brightness of the conventional transflective LCD devices is low, which may affect the user experience.

SUMMARY

In one aspect, the present disclosure relates to a transflective array substrate, including: a plurality of scanning lines, a plurality of data lines intersecting with the scanning lines, and a plurality of pixel cells surrounded by the scanning lines and the data lines, wherein each of the pixel cells includes a thin film transistor (TFT), a photoresist layer, and at least one pixel electrode, the TFT electrically connects to the scanning line, the data line, and the pixel electrode respectively, and the photoresist layer is configured on the TFT; each of the pixel cells further including a reflective area, wherein the reflective layer is configured above the photoresist layer to prevent ambient light beams from being filtered by the photoresist layer when the ambient light beams enter the reflective area.

In another aspect, the present disclosure relates to a manufacturing method of a transflective array substrate, wherein the transflective array substrate includes a plurality of pixel cells, each of the pixel cells includes a reflective area, and the manufacturing method includes: arranging a plurality of scanning lines, a plurality of data lines intersecting with the scanning lines, and a plurality of TFTs, wherein the TFT is surrounded by the scanning lines and the data lines; arranging a photoresist layer above the TFT corresponding to each of the pixel cells; arranging at least one pixel electrode above the photoresist layer corresponding to each of the pixel cells, wherein the TFT electrically connects to the pixel electrode; arranging a reflective layer within the reflective area, wherein the reflective layer is configured above the photoresist layer, so as to prevent ambient light beams from being filtered by the photoresist layer when the ambient light beams enter the reflective area.

In another aspect, the present disclosure relates to a display device, including a transflective array substrate, wherein the transflective array substrate includes: a plurality of scanning lines, a plurality of data lines intersecting with the scanning lines, and a plurality of pixel cells surrounded by the scanning lines and the data lines, wherein each of the pixel cells includes a thin film transistor (TFT), a photoresist layer, and at least one pixel electrode, the TFT electrically connects to the scanning line, the data line, and the pixel electrode respectively, and the photoresist layer is configured on the TFT; each of the pixel cells further including a reflective area, wherein the reflective layer is configured above the photoresist layer to prevent ambient light beams from being filtered by the photoresist layer when the ambient light beams enter the reflective area.

The TFT includes: a gate configured on the same layer with the scanning lines, and a source and a drain configured on the same layer with the data lines, wherein the gate electrically connects to the scanning line, the source electrically connects to the data line, and the drain electrically connects to the pixel electrode; the photoresist layer is configured between the data line and the pixel electrode, and the reflective layer is configured above the pixel electrode.

The transflective array substrate further includes a first insulation layer, a second insulation layer, a third insulation layer, and a fourth insulation layer; wherein the first insulation layer is configured between the scanning line and the data line; the second insulation layer is configured between the data line and the photoresist layer; the third insulation layer is configured between the photoresist layer and the pixel electrode, a through hole is configured on the third insulation layer, wherein the through hole penetrates the third insulation layer, the photoresist layer, and the second insulation layer, the drain is exposed by the through hole, and the pixel electrode electrically connects to the drain via the through hole; the fourth insulation layer is configured between the pixel electrode and the reflective layer.

The transflective array substrate further includes: a semiconductor layer, wherein the semiconductor layer is configured on the first insulation layer, and the semiconductor layer respectively connects to the source and the drain.

The transflective array substrate further includes: a common electrode, wherein the common electrode is configured on the reflective layer.

In view of the above, the present disclosure relates to a display device, a transflective array substrate, and a manufacturing method thereof. The transflective array substrate may include a plurality of scanning lines, a plurality of data lines intersecting with the scanning lines, and a plurality of pixel cells surrounded by the scanning lines and the data lines. Each of the pixel cells may include a TFT, a photoresist layer, and at least one pixel electrode. The TFT respectively electrically connects to the scanning line, the data line, and the pixel electrode. The photoresist layer is configured on the TFT. Each of the pixel cells may further include a reflective area, wherein a reflective layer is configured within the reflective area. The reflective layer is configured above the photoresist layer to prevent ambient light beams from being filtered by the photoresist layer when the ambient light beams enter the reflective area. As such, the ambient light beams may first come into contact with the reflective layer and may be reflected by the reflective layer. The reflected light beams may not enter the photoresist layer and may not be filtered by the photoresist layer. So as to improve light-reflection efficiency, improve brightness of the display device, and provide better user experience.

DETAILED DESCRIPTION

Figure 1A:
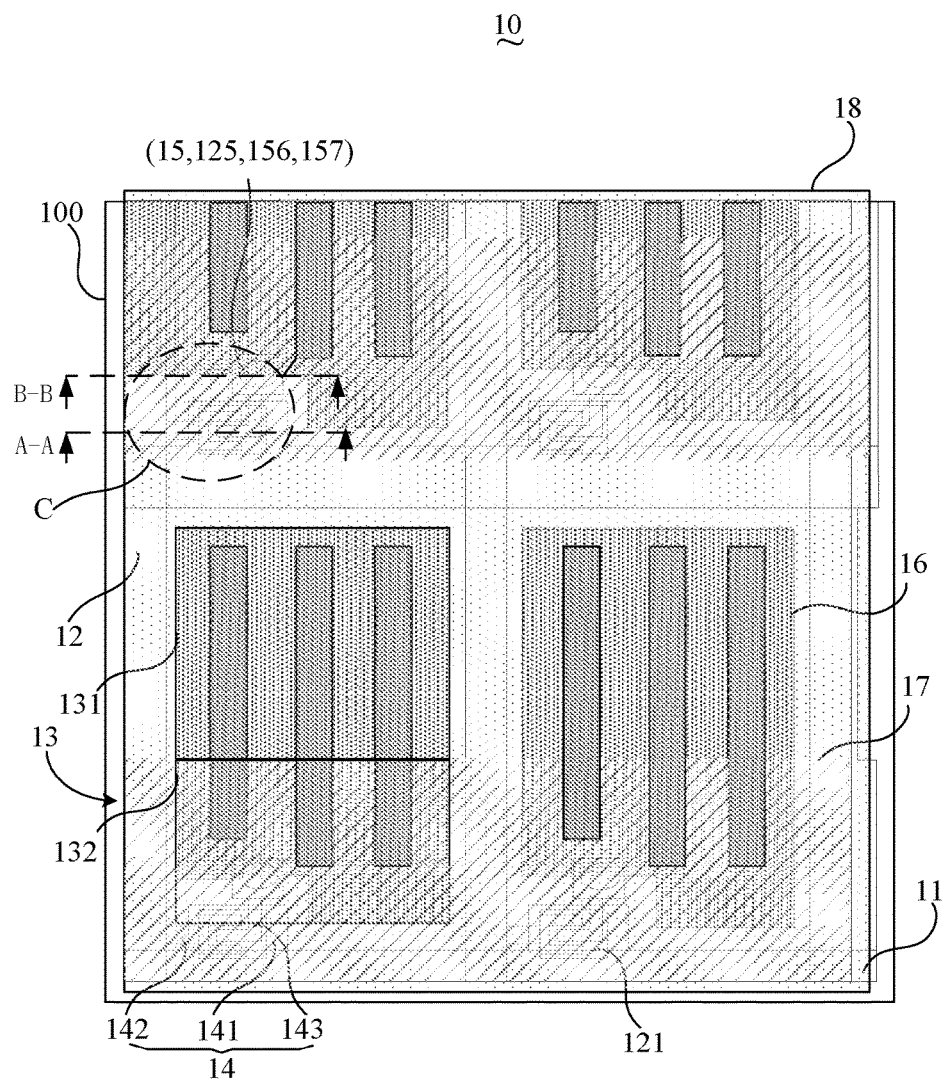
FIG. 1A is a schematic view of a transflective array substrate in accordance of one embodiment of the present disclosure.
Figure 1B:
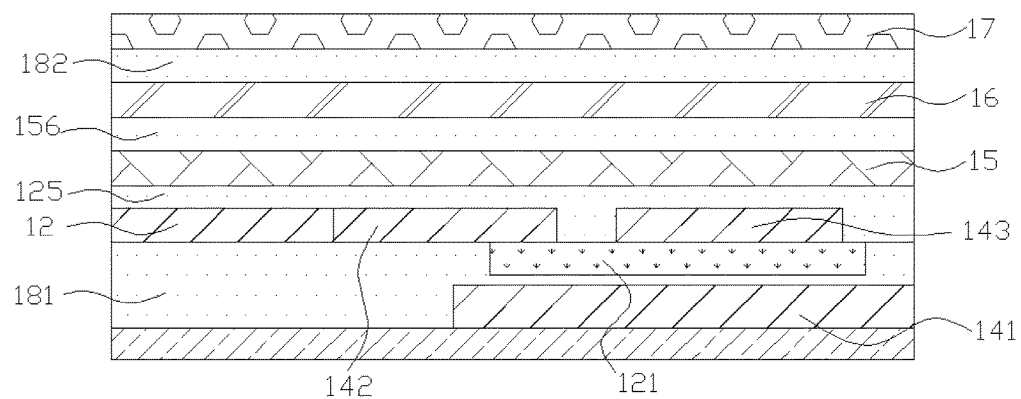
FIG. 1B is a cross-sectional view of a region C in FIG. 1A along a line A-A.
Figure 1C:
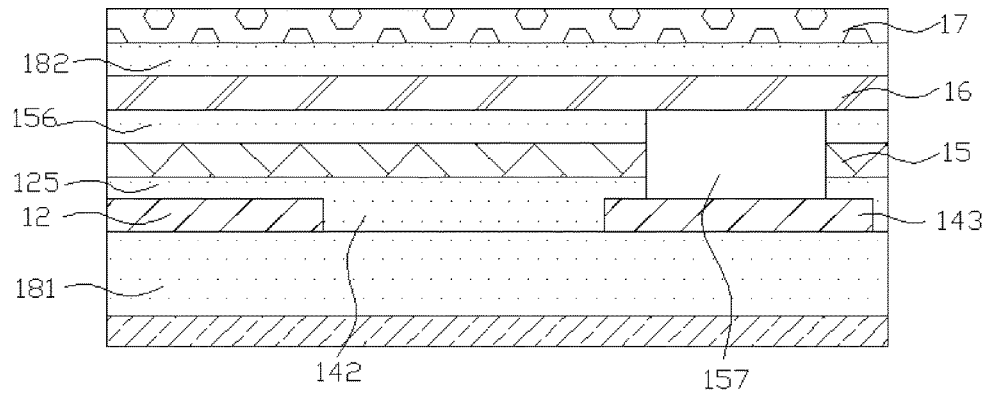
FIG. 1C is a cross-sectional view of the region C in FIG. 1A along a line B-B.

FIG. 1A is a schematic view of a transflective array substrate in accordance of one embodiment of the present disclosure; FIG. 1B is a cross-sectional view of a region C in FIG. 1A along a line A-A; and FIG. 1C is a cross-sectional view of the region C in FIG. 1A along a line B-B. Referring to FIGS. 1A, 1B and 1C, the present disclosure relates to the transflective array substrate 10, including: a plurality of scanning lines 11, a plurality of data lines 12 intersecting with the scanning lines 11, and a plurality of pixel cells 13 surrounded by the scanning lines 11 and the data lines 12. Each of the pixel cells 13 may include a thin film transistor (TFT) 14, a photoresist layer 15, and at least one pixel electrode 16. The TFT 14 electrically connects to the scanning line 11, the data line 12, and the pixel electrode 16 respectively. The photoresist layer 15 is configured on the TFT 14.

Each of the pixel cells 13 may further include a transmissive area 131 and a reflective area 132. The transmissive area 131 may display images only by light beams provided by a backlight module. The reflective area 132 may display the images by ambient light beams. In one example, a reflective layer 17 is configured in the reflective area 132. The reflective layer 17 is configured above the photoresist layer 15 to prevent the ambient light beams from being filtered by the photoresist layer 15 when the ambient light beams enter the reflective area 132. Dimensions of the transmissive area 131 and the reflective area 132 of the pixel cell 13 may be adjusted according to actual requirements.

As such, the ambient light beams may first come into contact with the reflective layer 17, and may be reflected by the reflective layer 17. The reflected light beams may not enter and may not be filtered by the photoresist layer 15. So as to improve light-reflection efficiency, improve the brightness of display devices, and provide better user experience. In one example, the reflective layer 17 may be a common (COM) metal structure. A thickness of the reflective layer 17 may be in a range from 1000 A to 3000 A. The reflective layer 17 may be made of metal or alloy, such as Al, Mo, and Cu. In one example, the TFT 14 may include a gate 141 configured on the same layer with the scanning lines 11, and a source 142 and a drain 143 configured on the same layer with the data lines 12. The gate 141 electrically connects to the scanning line 11. The source 142 electrically connects to the data line 12. The drain 143 electrically connects to the pixel electrode 16. Specifically, the scanning line 11 and the gate 141 may be configured on a glass substrate 100. The scanning line 11 and the gate 141 may be made of the same metal material, wherein the metal material may be metal or alloy, such as Al, Mo, and Cu. Thicknesses of the scanning lines 11 and the gate 141 may be in a range from 3000 A to 6000 A. The data line 12, the source 142, and the drain 143 are configured above the gate 141 and the scanning lines 11. Material and thickness of the data line 12, the source 142, and the drain 143 may be the same with the scanning line 11 and the gate 141. The pixel electrode 16 is configured above the data line 12, the source 142, and the drain 143, and the pixel electrode 16 may be made of transparent conductive material, such as indium tin oxide (ITO) thin film. A thickness of the pixel electrode 16 may be in a range from 400 A to 1000 A.

A first insulation layer 181 is configured between the first the scanning line 11 and the data line 12. It is noted that the first insulation layer 181 also isolates and insulates the gate 141 from the source 142 and the drain 143. The first insulation layer 181 may be made of SiNx. A thickness of the first insulation layer 181 may be in a range from 2000 A to 5000 A.

A semiconductor layer 121 is further configured on the first insulation layer 181, and the semiconductor layer 121 electrically connects to the source 142 and the drain 143 respectively. In one example, a thickness of the semiconductor layer 121 may be in a range from 1500 A to 3000 A. If the scanning line 11 has not received scanning driving signals, the semiconductor layer 121 is at an insulator state, and the source 142 and the drain 143 are not connected. The TFT 14 is at a turn-off state. If the scanning line 11 receives the scanning driving signals, the semiconductor layer 121 is at a conductor state. The source 142 may connect to the drain 143. Voltage signals may be transmitted from the data line 12 to the drain 143 via the source 142 and the semiconductor layer 121. The voltage signals may be further transmitted to the pixel electrode 16. The pixel electrode 16 is configured to control liquid crystals to change directions according to the voltage signals. So as to control passing-rate of the light beams provided by the backlight module, and to obtain image-brightness.

The light beams are filtered by the photoresist layer 15, and the light beams of a required color may be obtained. A pixel may usually include three sub-pixels, respectively emitting red light (R), green light (G), and blue light (B). So that, the photoresist layer 15 of the three adjacent pixel cells 13 is respectively configured to obtain the red light, the green light, and the blue light.

The light beams of the required color may be obtained by conducting a color-filtering process on the ambient light beams via the photoresist layer 15. For the reflective area 132, if color of the ambient light beams is partially filtered by the photoresist layer 15, the light-reflection efficiency of the reflective area 132 may be lowered-down, and the brightness of the display device may be reduced. Therefore, the photoresist layer 15 is configured above the data line 12, the pixel electrode 16 is configured above the photoresist layer 15, and the reflective layer 17 is configured above the pixel electrode 16. So as to prevent the ambient light beams from being filtered by the photoresist layer 15 when the ambient light beams enter the reflective area 132.

In one example, a second insulation layer 125 is configured between the data lines 12 and the photoresist layer 15. The second insulation layer 125 may be made of SiN. A thickness of the second insulation layer 125 may be in a range from 1000 A to 5000 A.

In one example, a third insulation layer 156 is configured between the photoresist layer 15 and the pixel electrode 16. A through hole 157 is configured on the third insulation layer 156, wherein the through hole 157 penetrates the third insulation layer 156, the photoresist layer 15, and the second insulation layer 12. The drain 143 is exposed by the through hole 157. The pixel electrode 16 is configured on the third insulation layer 156 and electrically connects to the drain 143 via the through hole 157. The third insulation layer 156 may also be made of SiN. A thickness and material of the third insulation layer 156 may be the same with the first insulation layer 181 or the second insulation layer 125.

In one example, a fourth insulation layer 182 is configured between the pixel electrode 16 and the reflective layer 17. The fourth insulation layer 182 may be made of the SiNx. A thickness of the fourth insulation layer 182 may be in the range from 1000 A to 5000 A. A through-hole structure within a peripheral terminal area may be configured on the fourth insulation layer 182. A peripheral component may connect to a corresponding component of the array substrate via the through-hole structure.

In one example, a common electrode 18 is configured on the reflective layer 17. The common electrode 18 may be made of the transparent conductive material, such as ITO thin film. A thickness of the common electrode 18 may be in the range from 400 A to 1000 A.

In view of the above, the photoresist layer 15 may be configured on the array substrate 10, and the reflective layer 17 is configured between the common electrode 18 and the photoresist layer 15. As such, driving uniformity of the common electrode 18 may be improved, the reflective layer 17 may prevent the ambient light beams from being filtered by the photoresist layer 15 when the ambient light beams enter the reflective area 132. The ambient light beams may directly be reflected by the photoresist layer 15. So as to improve the light-reflection efficiency and the brightness of the display device.

Figure 2:
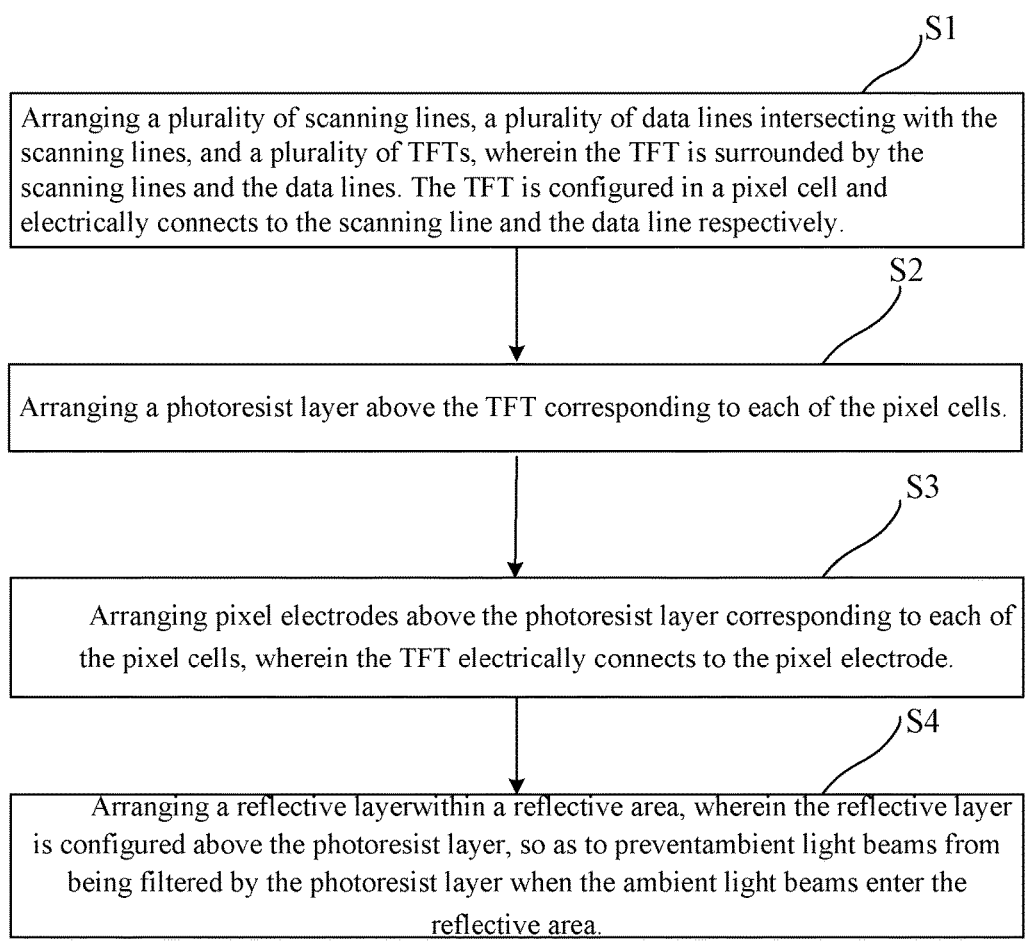
FIG. 2 is a flowchart illustrating a manufacturing method of a transflective array substrate in accordance of one embodiment of the present disclosure.
Figure 3:
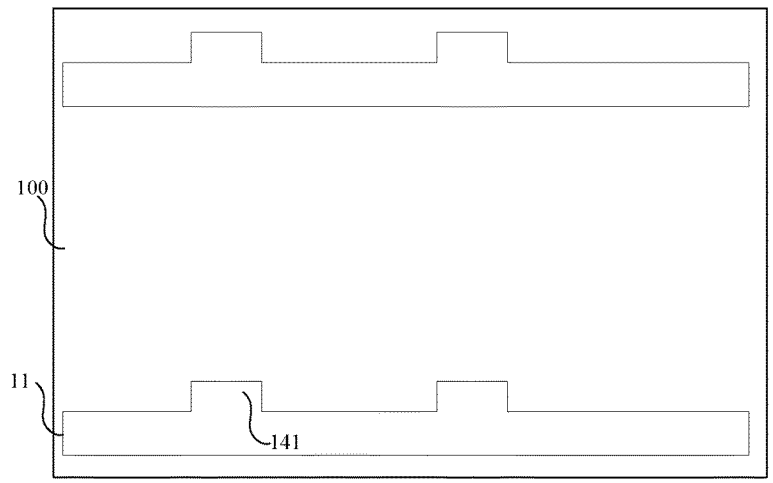
FIGS. 3 to 6 are schematic views illustrating a manufacturing process of the manufacturing method shown in FIG. 2.
Figure 3:
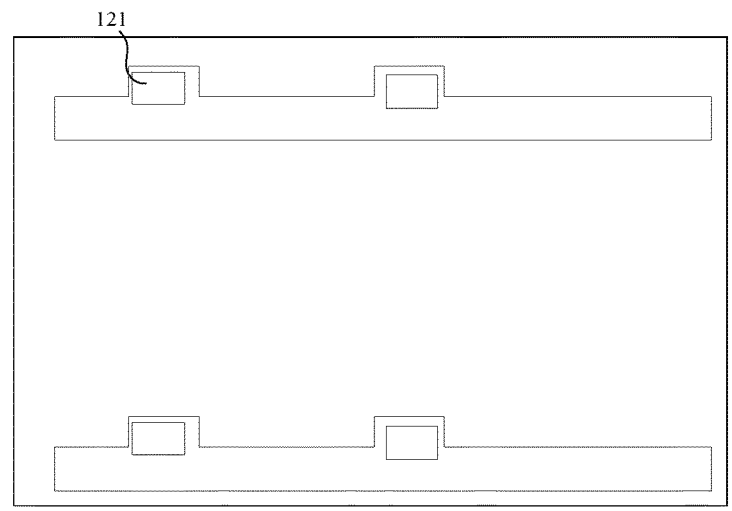
Figure 3:
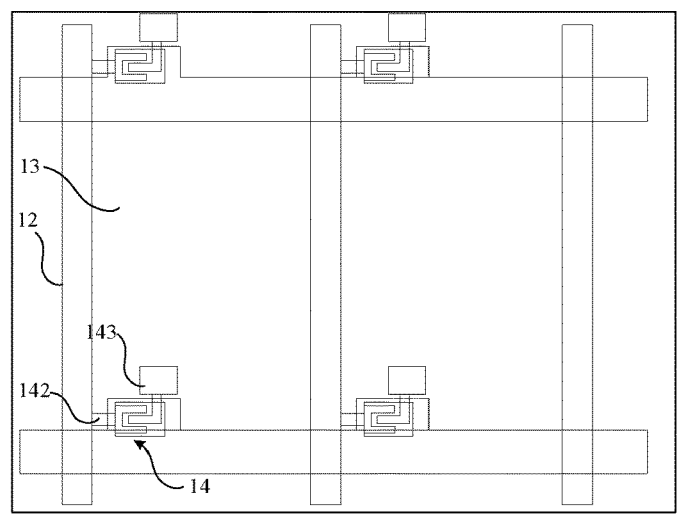
Figure 4:
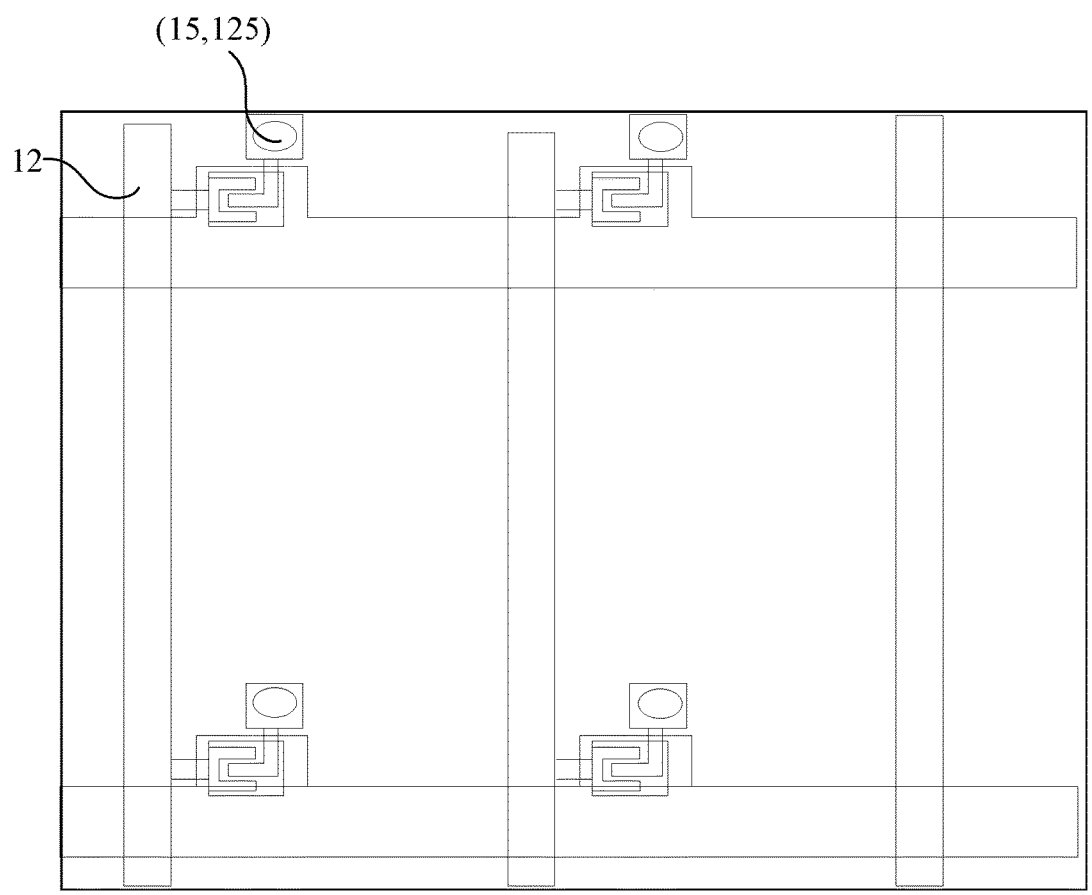
Figure 5:
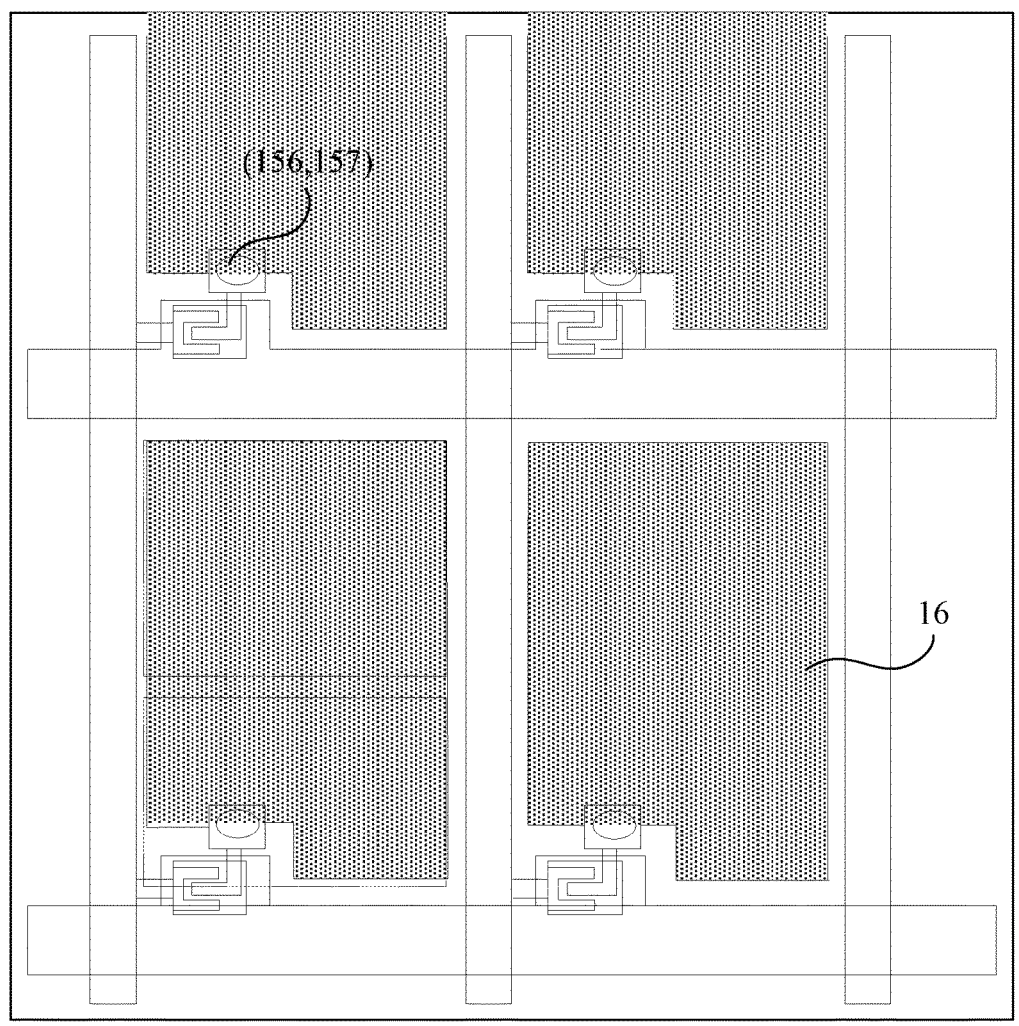
Figure 6:
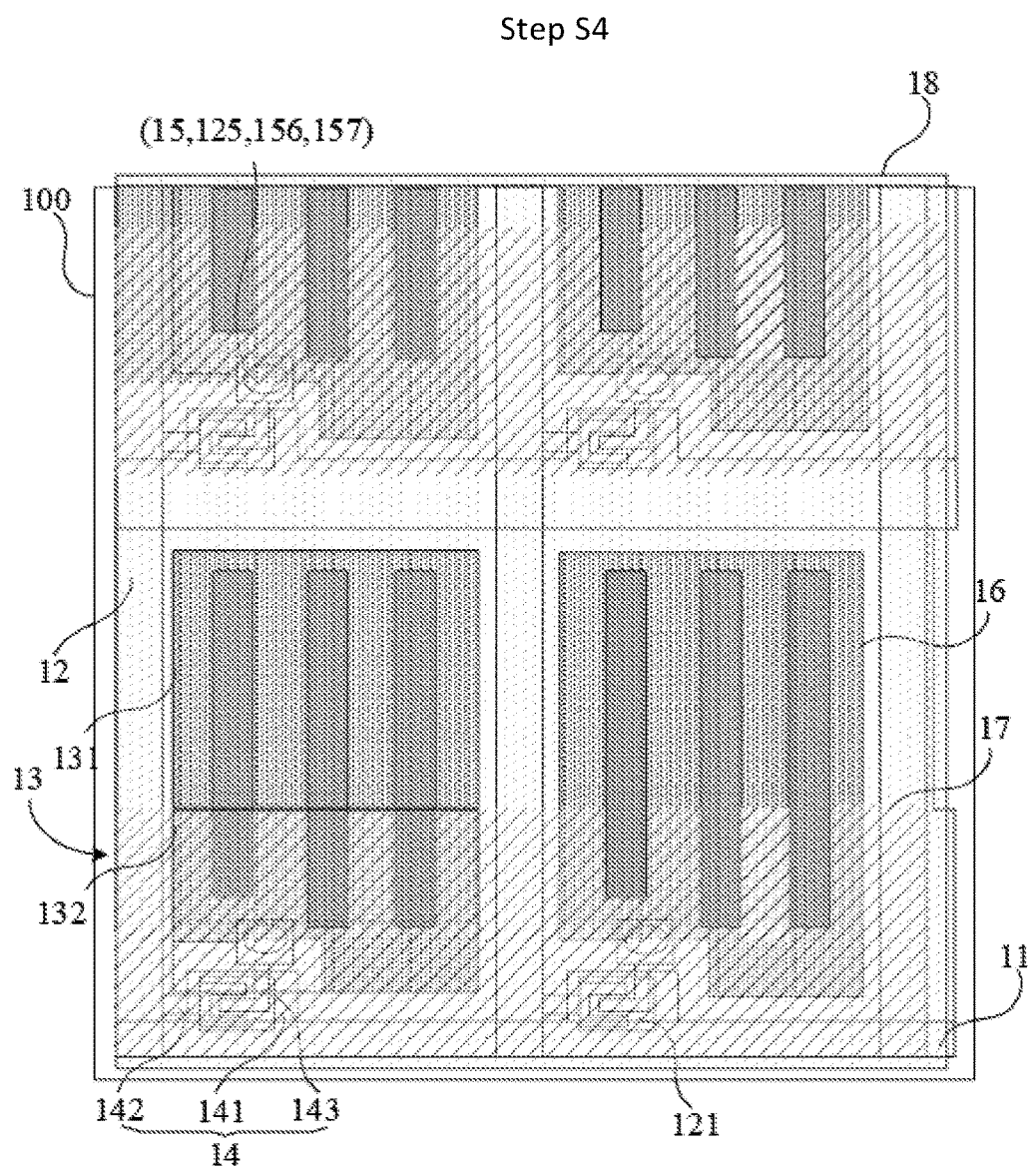

In another aspect, the present disclosure relates to a manufacturing method of the transflective array substrates. The transflective array substrate described in above may be manufactured by the manufacturing method. FIG. 2 is a flowchart illustrating the manufacturing method of the transflective array substrate in accordance of one embodiment of the present disclosure. FIGS. 3 to 6 are schematic views illustrating a manufacturing process of the manufacturing method shown in FIG. 2.

The transflective array substrate 10 may include a plurality of the pixel cells 13. Each of the pixel cells 13 may include the transmissive area 131 and the reflective area 132. The manufacturing method of the transflective array substrate 10 may include the following steps.

In step S1, arranging a plurality of scanning lines 11, a plurality of data lines 12 intersecting with the scanning lines 11, and a plurality of TFTs 14, wherein the TFT 14 is surrounded by the scanning lines 11 and the data lines 12. The TFT 14 is configured in the pixel cell 13 and electrically connects to the scanning line 11 and the data line 12 respectively.

Specifically, a gate metal layer is deposited on the glass substrate 100 by a physical vapor deposition (PVD) process. The gate metal layer may be made of metal or alloy, such as Al, Mo, and Cu. A thickness of the gate metal layer may be in the range from 3000 A to 6000 A. The scanning line 11 and the gate 141 of the TFT 14 may be formed by conducting an exposure process, a development process, a wet-etching process, and a peeling-off process on the gate metal layer via a mask plate. The gate 141 may electrically connect to the scanning line 11.

A source-drain metal layer is deposited above the scanning line 11 and the gate 141. Specifically, the source-drain metal layer is deposited above the scanning line 11 and the gate 141 by the PVD process. The source-drain metal layer may be made of the same material with the gate metal layer, and a thickness of the source-drain metal layer may be the same with the gate metal layer. The data line 12, and the source 142 and the drain 143 of the TFT 14 may be formed by conducting the exposure process, the development process, the wet-etching process, a dry-etching process, and the peeling-off process on the source-drain metal layer via the mask plate. The source 142 electrically connects to the data line 12, and the drain 143 electrically connects to the pixel electrode 16.

In one example, a gate insulation layer (not shown) may be deposited above the scanning line 11 and the gate 141 to form the first insulation layer 181 before the source-drain metal layer is deposited above the scanning line 11 and the gate 141. Specifically, the gate insulation layer 181 may be deposited by a plasma enhance chemical vapor deposition (PECVD) process. The gate insulation layer 181 may be made of SiNx. A thickness of the gate insulation layer 181 may be in the range from 2000 A to 5000 A.

In one example, an N-doped amorphous silicon layer may further be deposited on the first insulation layer 181. Specifically, the N-doped amorphous silicon layer may be deposited by the PECVD process. A thickness of the N-doped amorphous silicon layer may be in the range from 1500 A to 3000 A. The semiconductor layer 121 may be formed by conducting the exposure process, the development process, the dry-etching process, and the peeling-off process on the N-doped amorphous silicon layer via the mask plate.

In step S2, arranging the photoresist layer 15 above the TFT 14 corresponding to each of the pixel cells 13.

A photoresist insulation layer is deposited on the data line 12, and the source 142 and the drain 143 of the TFT 14 to form the second insulation layer 125 before the step S2. Specifically, the photoresist insulation layer may be deposited by the PECVD process. The photoresist insulation layer may be made of SiNx. A thickness of the photoresist insulation layer may be in the range from 1000 A to 5000 A.

In step S3, arranging the pixel electrodes 16 above the photoresist layer 15 corresponding to each of the pixel cells 13, wherein the TFT 14 electrically connects to the pixel electrode 16.

A flat layer is deposited on the photoresist layer 15 to form the third insulation layer 156 before the step S3. Specifically, the highly penetrating organic flat layer may be formed by the exposure process. A through-hole etching process may be conducted on the third insulation layer 156 to form the through hole 157, wherein the through hole 157 penetrates the third insulation layer 156, the photoresist layer 15, and the second insulation layer 125. the drain is exposed by the through hole 157.

A first conductive material layer may be deposited on the third insulation layer 156. Specifically, the first conductive material layer may be deposited on the third insulation layer 156 by the PVD process. The first conductive material layer may be made of the transparent conductive material, such as ITO thin film. A thickness of the first conductive material layer may be in the range from 400 A to 1000 A. The pixel electrode 16 may be formed by conducting the exposure process, the development process, the wet-etching process, and the peeling-off process on the first conductive material layer via the mask plate. The pixel electrode 16 may electrically connect to the drain 143 via the through hole 157.

In step S4, arranging the reflective layer 17 within the reflective area 132, wherein the reflective layer 17 is configured above the photoresist layer 15, so as to prevent the ambient light beams from being filtered by the photoresist layer 15 when the ambient light beams enter the reflective area 132.

In one example, an electrode insulation layer may be deposited on the pixel electrode 16 to form the fourth insulation layer 182 before the step S4. Specifically, the electrode insulation layer may be deposited by conducting the PECVD process. The fourth insulation layer 182 may be made of SiNx. A thickness of the fourth insulation layer 182 may be in the range from 1000 A to 5000 A. A through-hole structure within the peripheral terminal area may be formed by conducting the exposure process, the development process, the dry-etching process, and the peeling-off process on the fourth insulation layer 182 via the mask plate. The peripheral component may connect to the corresponding component of the array substrate via the through-hole structure.

A COM metal structure layer may be deposited by the PVD process. A thickness of the COM metal structure layer may be in the range from 1000 A to 3000 A. The COM metal structure layer may be made of metal or alloy, such as Al, Mo, and Cu. The reflective layer 17 may be formed by conducting the exposure process, the development process, the wet-etching process, and the peeling-off process on the COM metal structure layer via the mask plate.

In one example, a second conductive material layer may be deposited on the reflective layer 17. Specifically, the second conductive material layer may be deposited on the reflective layer 17 by the PVD process. The second conductive material layer may be made of the transparent conductive material, such as ITO. A thickness of the second conductive material layer may be in the range from 400 A to 1000 A. The common electrode 18 may be formed by conducting the exposure process, the development process, the wet-etching process, and the peeling-off process on the second conductive material layer via the mask plate.

Figure 7:
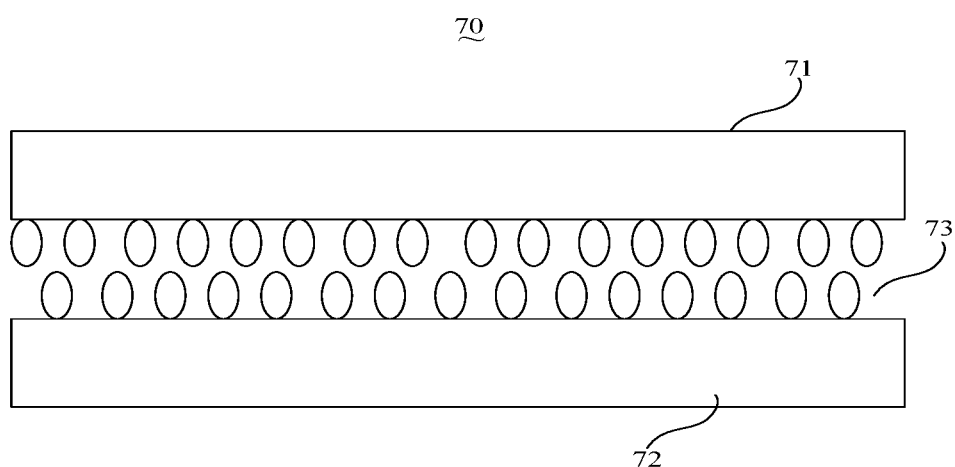
FIG. 7 is a schematic view of a display device in accordance of one embodiment of the present disclosure.

FIG. 7 is a schematic view of the display device in accordance of one embodiment of the present disclosure. As shown in FIG. 7, the present disclosure relates to the display device 70, including the array substrate 71, a color film substrate 72 arranged opposite to the array substrate 71, and a liquid crystal layer 73 configured between the array substrate 71 and the color film substrate 72. The array substrate 71 may be the transflective array substrate, including the transflective array substrate 10 described in above.

In view of the above, the present disclosure is configured to improve light-reflection efficiency, improve the brightness of the display device, and provide better user experience.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. A manufacturing method of a transflective array substrate, wherein the transflective array substrate comprises a plurality of pixel cells, each of the pixel cells comprises a reflective area, and the manufacturing method comprises:
   arranging a plurality of scanning lines, a plurality of data lines intersecting with the scanning lines, and a plurality of TFTs, wherein the TFT is surrounded by the scanning lines and the data lines, the TFT is configured within the pixel cell, and the TFT electrically connects to the scanning line and the data line respectively;
   arranging a photoresist layer above the TFT corresponding to each of the pixel cells;
   arranging at least one pixel electrode above the photoresist layer corresponding to each of the pixel cells, wherein the TFT electrically connects to the pixel electrode;
   arranging a reflective layer within the reflective area, wherein the reflective layer is configured above the photoresist layer, so as to prevent ambient light beams from being filtered by the photoresist layer when the ambient light beams enter the reflective area;
   wherein step of arranging a plurality of the scanning lines, a plurality of the data lines intersecting with the scanning lines, and a plurality of the TFTs further comprises:
   depositing a gate metal layer on a glass substrate;
   forming the scanning lines and a gate of the TFT by conducting an exposure process, a development process, a wet-etching process, and a peeling-off process on the gate metal layer, wherein the gate electrically connects to the scanning line;
   depositing a source-drain metal layer above the scanning line and the gate;
   forming the data lines, and a source and a drain of the TFT by conducting the exposure process, the development process, the wet-etching process, a dry-etching process, and the peeling-off process on the source-drain metal layer, wherein the source electrically connects to the data line, and the drain electrically connects to the pixel electrode;
   wherein, before the step of depositing the source-drain metal layer above the scanning line and the gate, the manufacturing method further comprises:
   depositing a gate insulation layer above the scanning line and the gate to form a first insulation layer;
   depositing an N-doped amorphous silicon layer on the first insulation layer;
   forming a semiconductor layer by conducting the exposure process, the development process, the dry-etching process, and the peeling-off process on the N-doped amorphous silicon layer;
   before the step of arranging the photoresist layer above the TFT corresponding to each of the pixel cells, the manufacturing method further comprises:
   depositing a photoresist insulation layer on the data line, and the source and the drain of the TFT to form a second insulation layer;
   before the step of arranging at least one pixel electrode above the photoresist layer corresponding to each of the pixel cells, the manufacturing method further comprises:
   depositing a flat layer on the photoresist layer to form a third insulation layer;
   forming a through hole by conducting a through-hole etching process on the third insulation layer, wherein the through hole penetrates the third insulation layer, the photoresist layer, and a second insulation layer, the drain is exposed by the through hole;
   the step of arranging the pixel electrode above the photoresist layer corresponding to each of the pixel cells further comprises:
   depositing a first conductive material layer on the third insulation layer;
   forming the pixel electrode by conducting the exposure process, the development process, the wet-etching process, and the peeling-off process on the first conductive material layer, wherein the pixel electrode electrically connects to the drain via the through hole;
   before the step of arranging the reflective layer, the manufacturing method further comprises:
   depositing an electrode insulation layer on the pixel electrode to form a fourth insulation layer.

2. The manufacturing method according to claim 1, wherein the manufacturing method further comprises:
   depositing a second conductive material on the reflective layer;
   forming a common electrode by conducting the exposure process, the development process, the wet-etching process, and the peeling-off process on the second conductive material layer.

\* \* \* \* \*